(12) United States Patent
Cabral, Jr. et al.

(10) Patent No.: US 8,841,770 B2
(45) Date of Patent: *Sep. 23, 2014

(54) SEMICONDUCTOR INTERCONNECT STRUCTURE HAVING ENHANCED PERFORMANCE AND RELIABILITY

(71) Applicant: International Business Machines Corporation, Armonk, NY (US)

(72) Inventors: Cyril Cabral, Jr., Mahopac, NY (US); Geraud J. M. Dubois, Los Altos, CA (US); Daniel C. Edelstein, White Plains, NY (US); Takeshi Nogami, Schenectady, NY (US); Daniel P. Sanders, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/080,160

(22) Filed: Nov. 14, 2013

(65) Prior Publication Data

US 2014/0070418 A1 Mar. 13, 2014

Related U.S. Application Data

(63) Continuation of application No. 13/246,904, filed on Sep. 28, 2011.

(51) Int. Cl.
*H01L 23/48* (2006.01)
*H01L 23/532* (2006.01)
*H01L 21/768* (2006.01)
*H01L 23/522* (2006.01)

(52) U.S. Cl.
CPC ...... *H01L 23/5226* (2013.01); *H01L 23/53266* (2013.01); *H01L 21/76873* (2013.01); *H01L 21/76846* (2013.01); *H01L 23/53209* (2013.01); *H01L 23/53223* (2013.01); *H01L 23/53238* (2013.01); *H01L 21/76849* (2013.01); *H01L 21/76831* (2013.01); *H01L 21/76867* (2013.01)
USPC ...... 257/751; 257/762; 257/774; 257/E23.16; 257/E21.584

(58) Field of Classification Search
USPC ............ 257/751, 762, 774, E23.16, E21.584
See application file for complete search history.

(56) References Cited

U.S. PATENT DOCUMENTS 5,933,717 A 8/1999 Hause et al.
6,306,776 B1 10/2001 Srinivasan et al.
(Continued)

FOREIGN PATENT DOCUMENTS

EP 1933603 A1 6/2008
WO 2011050073 A1 4/2011

OTHER PUBLICATIONS

Hamada et al. "Highly reliable 45-nm-half-pitch Cu interconnects incorporating a Ti/TaN multilayer barrier," 2010 International Interconnect Technology Conference (IITC), pp. 1-3, Jun. 6-9, 2010, IEEE. doi: 10.1109/IITC.2010.5510594.

(Continued)

*Primary Examiner* — Jasmine Clark
(74) *Attorney, Agent, or Firm* — Nicholas L. Cadmus

(57) ABSTRACT

An interconnect structure and method for fabricating the interconnect structure having enhanced performance and reliability, by minimizing oxygen intrusion into a seed layer and an electroplated copper layer of the interconnect structure, are disclosed. At least one opening in a dielectric layer is formed. A sacrificial oxidation layer disposed on the dielectric layer is formed. The sacrificial oxidation layer minimizes oxygen intrusion into the seed layer and the electroplated copper layer of the interconnect structure. A barrier metal layer disposed on the sacrificial oxidation layer is formed. A seed layer disposed on the barrier metal layer is formed. An electroplated copper layer disposed on the seed layer is formed. A planarized surface is formed, wherein a portion of the sacrificial oxidation layer, the barrier metal layer, the seed layer, and the electroplated copper layer are removed. In addition, a capping layer disposed on the planarized surface is formed.

19 Claims, 6 Drawing Sheets

(56) References Cited

U.S. PATENT DOCUMENTS

| | | |
|---|---|---|
| 6,399,496 B1 | 6/2002 | Edelstein et al. |
| 6,479,902 B1 | 11/2002 | Lopatin et al. |
| 6,720,262 B2 | 4/2004 | Koh et al. |
| 6,740,580 B1 | 5/2004 | Gupta et al. |
| 6,812,126 B1 | 11/2004 | Paranjpe et al. |
| 7,247,946 B2 | 7/2007 | Bruley et al. |
| 7,498,256 B2 | 3/2009 | Knarr et al. |
| 7,545,040 B2 | 6/2009 | Ueki et al. |
| 7,642,189 B2 | 1/2010 | Chang et al. |
| 7,651,943 B2 | 1/2010 | Yu et al. |
| 7,956,463 B2 | 6/2011 | Yang et al. |
| 7,956,465 B2 | 6/2011 | Huang |
| 8,089,157 B2 | 1/2012 | Cabral, Jr. et al. |
| 2007/0264816 A1 | 11/2007 | Lavoie et al. |
| 2008/0124924 A1 | 5/2008 | Naik |
| 2008/0237858 A1 | 10/2008 | Nihei |
| 2009/0004385 A1 | 1/2009 | Blackwell et al. |
| 2009/0277386 A1 | 11/2009 | Takagi et al. |
| 2010/0140802 A1 | 6/2010 | Matsumoto et al. |
| 2011/0127673 A1 | 6/2011 | Anderson et al. |
| 2012/0228771 A1 | 9/2012 | Edelstein et al. |

OTHER PUBLICATIONS

Hayashi et al. "Impact of oxygen on Cu surface for highly reliable low-k/Cu interconnects with CuSiN and Ti-based barrier metal," 2010 International Interconnect Technology Conference (IITC), pp. 1-3, Jun. 6-9, 2010, IEEE. doi: 10.1109/IITC.2010.5510456.

Kohama et al. "Characterization of self-formed Ti-based barrier layers in Cu(Ti)/dielectric-layer samples using X-ray Photoelectron Spectroscopy," 2010 International Interconnect Technology Conference (IITC), pp. 1-2, Jun. 6-9, 2010, IEEE. doi: 10.1109/IITC.2010.5510318.

Kondoh et al. "Interconnection Formation by Doping Chemical-Vapor-Deposition Aluminum with Copper Simultaneously: Al-Cu CVD," J. Electrochem. Soc., vol. 141, No. 12, pp. 3494-3499, Dec. 1994 Copyright the Electrochemical Society, Inc.

Ohmori et al. "A key of self-formed barrier technique for reliability improvement of Cu dual damascene interconnects," 2010 International Interconnect Technology Conference (IITC), pp. 1-3, Jun. 6-9, 2010, IEEE. doi: 10.1109/IITC.2010.5510585.

U.S. Appl. No. 13/246,904, filed Sep. 28, 2011 entitled "Semiconductor Interconnect Structure Having Enhanced Performance and Reliability."

SEMICONDUCTOR INTERCONNECT STRUCTURE HAVING ENHANCED PERFORMANCE AND RELIABILITY

CROSS REFERENCE TO RELATED APPLICATION

This application is a continuation of U.S. patent application Ser. No. 13/246,904, entitled "SEMICONDUCTOR INTERCONNECT STRUCTURE HAVING ENHANCED PERFORMANCE AND RELIABILITY," filed Sep. 28, 2011, the disclosure of which is hereby incorporated herein by reference in its entirety for all purposes.

BACKGROUND OF THE INVENTION

1. Field of the Invention

The present invention relates to a semiconductor integrated circuit interconnect structure and method for fabricating an interconnect structure having enhanced performance and reliability, by minimizing oxygen intrusion into a seed layer and an electroplated copper layer of the interconnect structure.

2. Description of the Related Art

Semiconductor devices include a plurality of circuit components (i.e., transistors, resistors, diodes, capacitors, etc.) connected together to form an integrated circuit fabricated on a semiconductor substrate. A complex network of semiconductor integrated circuit interconnects (interconnects) are routed to connect the circuit components distributed on the surface of the substrate. Efficient routing of these interconnects, across semiconductor devices, requires formation of multi-level or multi-layered patterning schemes, such as single or dual damascene interconnect structures.

An interconnect structure includes metal vias that run perpendicular to the semiconductor substrate. The metal vias are disposed in trench areas. In addition, an interconnect structure includes metal lines that are disposed in the trench areas, wherein the trench areas are formed in dielectric material. The metal vias are connected to the metal lines, and the metal lines run parallel to the semiconductor substrate. Thus, both the metal lines and metal vias are disposed proximately to the dielectric material having a dielectric constant of less than 5.0, which enhances signal speed and minimizes signal crosstalk (i.e., crosstalk refers to a signal being transmitted through a metal line, and affecting another signal being transmitted through a separate metal line, and/or affecting other parts of circuitry in an undesired manner).

Furthermore, an interconnect structure that is copper (Cu) based, when compared with an aluminum (Al) based interconnect structure, provides higher speed signal transmission between large numbers of transistors on a complex semiconductor chip. Accordingly, when manufacturing integrated circuits, copper (i.e., a metal conductor) is typically used for forming the semiconductor integrated circuit's interconnects, because of copper's low resistivity and high current carrying capacity. Resistivity is the measure of how much a material opposes electric current, due to a voltage being placed across the material. However, when copper is utilized to form interconnects, electromigration may occur.

Electromigration is the gradual displacement of atoms of a metal conductor due to high density of current passing through the metal conductor, and electromigration is accelerated when the temperature of the metal conductor increases. Electromigration can result in void formation as well as extrusion/hillock formation along regions of an interconnect structure. The voids can result in an open circuit if one or more voids formed are large enough to sever the interconnect structure, and the extrusions/hillocks can result in a short circuit if one or more extrusions/hillocks are sufficiently long to form a region of abnormally low electrical impedance.

In addition, if an interconnect structure is copper based, oxygen intrusion into copper areas of the interconnect structure causes oxidation of diffusion barrier material of the interconnect structure, wherein an oxidized barrier interface is formed. The oxidized barrier interface is susceptible to serving as an electromigration void nucleation site, which can result in faster growth of large electromigration voids. The oxygen intrusion can be caused by oxygen from moisture in the surrounding dielectric layers and/or by oxygen from other layers (e.g., barrier metal layer) of the interconnect structure. Specifically, oxygen that intrudes the seed layer and electroplated copper layer may consume impurities within the interconnect structure, for example manganese and aluminum impurities, and prevent the impurities from segregating in certain regions of the interconnect structure that are susceptible to copper diffusion.

The segregating of impurities in certain regions of the interconnect structure that are susceptible to copper diffusion is important for suppressing copper diffusion. Copper diffusion can result in an increased amount of void formation and extrusion/hillock formation within the interconnect structure. Thus, if there is insufficient segregation of impurities in certain regions of the interconnect structure that is susceptible to copper diffusion then copper diffusion may not be adequately suppressed. Failure to adequately suppress copper diffusion within the interconnect structure can result in reduced performance and reliability of the interconnect structure due to electromigration.

Furthermore, integrated circuit manufacturers generally have electromigration requirements that should be satisfied as part of an overall quality assurance validation process, but thereafter electromigration may still persist during the lifetime of an integrated circuit in an end-user's computer (i.e., when current flows through the semiconductor integrated circuit's interconnect structure). As a semiconductor integrated circuit interconnect structure is generally formed using copper, which is a metal conductor susceptible to electromigration, electromigration presents a challenge when utilizing integrated circuits with a copper based interconnect structure. The challenge includes void formation and extrusion/hillock formation, caused by electromigration, as well as oxygen intrusion into the seed layer and the electroplated copper layer of the copper based interconnect structure. The void formation and extrusion/hillock formation can reduce integrated circuit performance, decrease reliability of interconnects, cause sudden data loss, and reduce the useful life of semiconductor integrated circuit products.

SUMMARY

The present invention relates to a structure and method for fabricating an interconnect structure having enhanced performance and reliability, by minimizing oxygen intrusion into a seed layer and an electroplated copper layer of the interconnect structure In one aspect, embodiments of the present invention provide an interconnect structure, and a method for fabricating the interconnect structure with at least one opening in a dielectric layer. A sacrificial oxidation layer is disposed on the dielectric layer. A barrier metal layer is disposed on the sacrificial oxidation layer. A seed layer is disposed on the barrier metal layer. An electroplated copper layer is disposed on the seed layer. A planarized surface is formed, wherein a portion of the sacrificial oxidation layer, the barrier metal layer, the seed layer, and the electroplated copper layer are removed. A capping layer is disposed on the planarized surface.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

Figure 1:
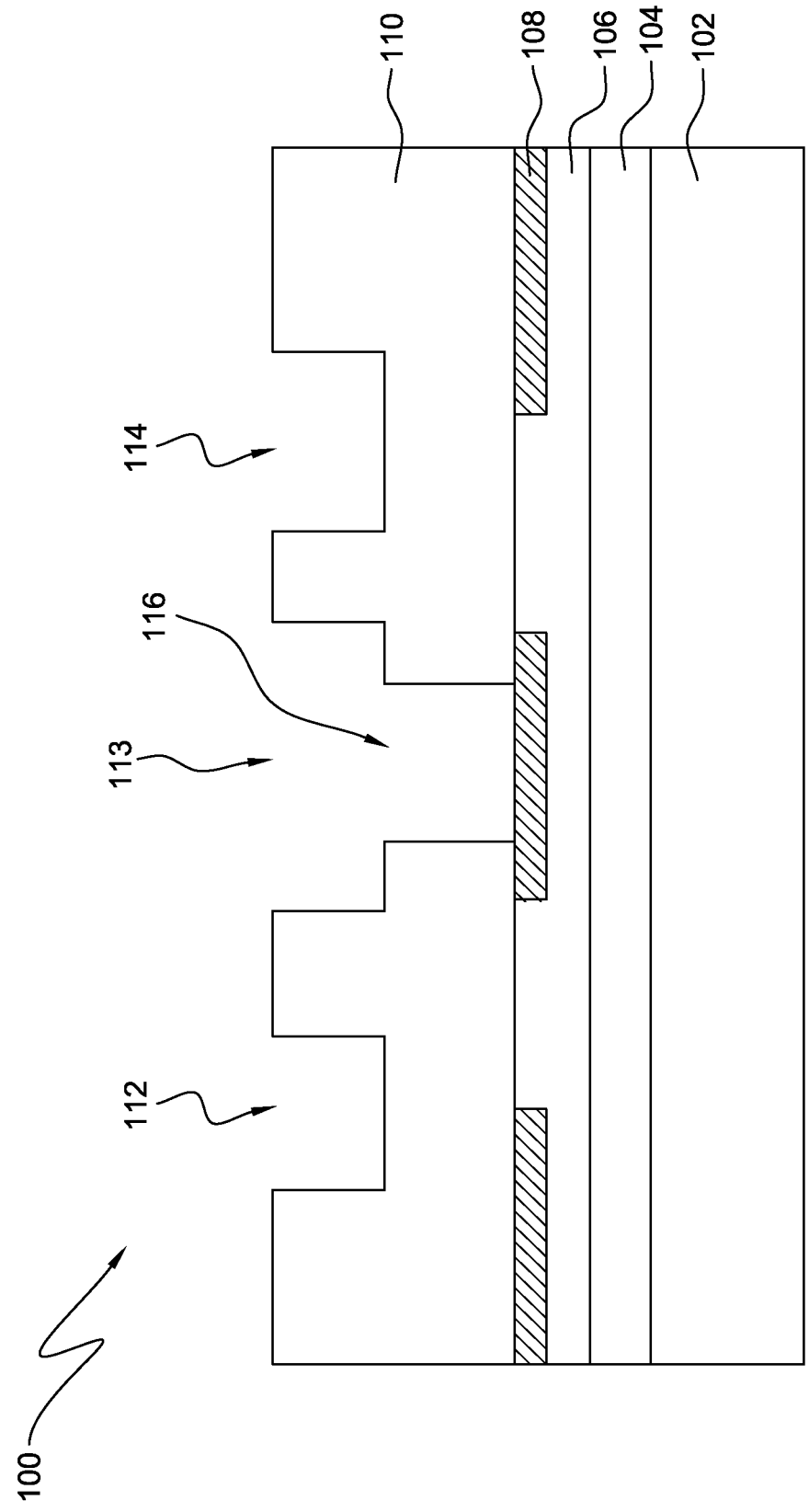
FIG. 1 is a pictorial representation (i.e., cross-sectional view) of a semiconductor illustrating the formation of trench areas and via holes (i.e., vias) according to one embodiment of the present invention.

The drawings are not necessarily to scale. The drawings, some of which are merely pictorial and schematic representations, are not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition it will be understood that when an element as a layer, region, or substrate is referred to as being "on" or "over", or "disposed on" another element, it can be directly on the other element or intervening elements may also be present. In contrast, when an element is referred to as being "directly on", "directly over", or "disposed proximately to" another element, there are no intervening elements present. It will also be understood that when an element is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

Embodiments of the present invention provide a semiconductor integrated circuit interconnect structure (interconnect structure) that minimizes oxygen intrusion into a seed layer and an electroplated copper layer of the interconnect structure in order to reduce void formation and extrusion/hillock formation within the interconnect structure caused by electromigration. Minimizing oxygen intrusion into the seed layer and the electroplated copper layer, in order to reduce void formation and extrusion/hillock formation, can improve integrated circuit performance, enhance reliability of interconnect structures, minimize sudden data loss, and enhance the useful lifetime of semiconductor integrated circuit products.

FIG. 1 illustrates a cross-sectional view of semiconductor 100 including a substrate 102, transistor area layer 104, first dielectric layer 106, first metal layer 108, second dielectric layer 110, and openings in second dielectric layer 110 for trench areas 112-114 and via hole 116. Specifically, dielectric layer 106 is formed on transistor area layer 104, wherein transistor area layer 104 is formed on substrate 102. Subsequent to a chemical-mechanical planarization (CMP) process of the first dielectric layer 106 and first metal layer 108, a second dielectric layer 110 is formed over first metal layer 108 and first dielectric layer 106. Moreover, trench areas 112-114 and via hole 116 are formed in second dielectric layer 110. Specifically, via hole 116 is formed in trench area 113. Consequently, a dual damascene structure, which includes trench areas 112-114 and via hole 116, is formed.

Figure 2:
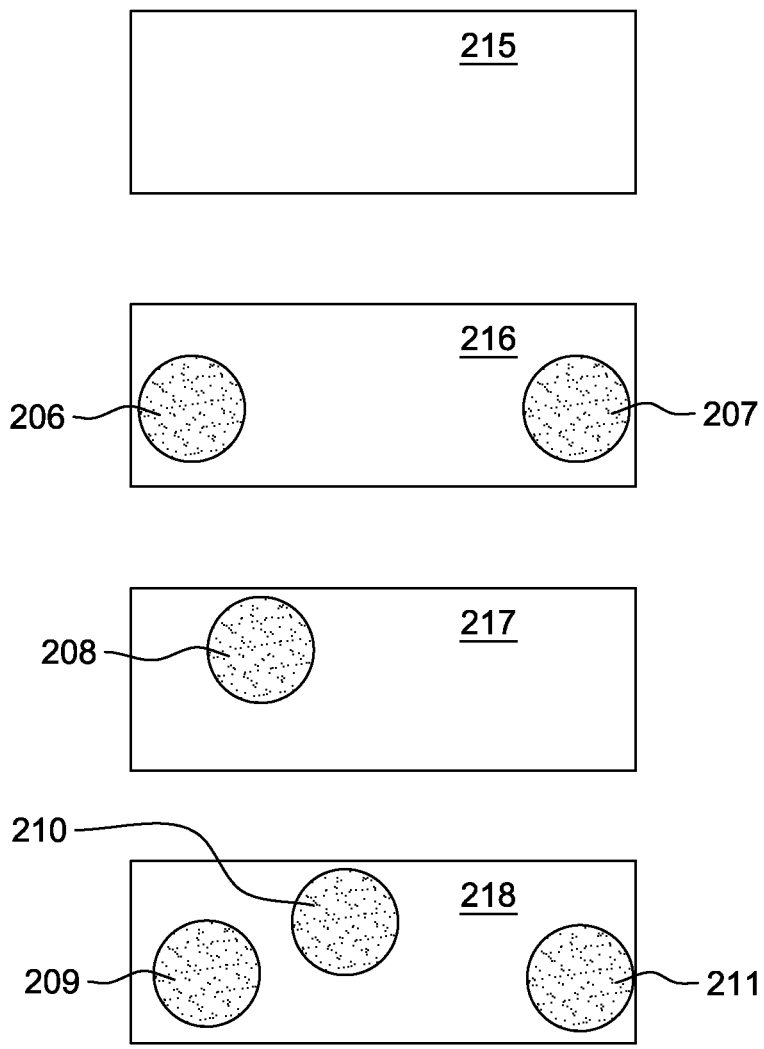
FIG. 2 depicts a top view of an array of trench areas and via holes (i.e., vias) according to one embodiment of the present invention.

FIG. 2 is a top view of an array of trench areas and via holes. Specifically, FIG. 2 depicts an array of trench areas 215-218 and via holes 206-211. A trench may not have any via holes such as trench area 215. However, trench areas can have one or more via holes such as depicted in trench areas 216-218. Moreover, via holes can be distributed uniformly in a trench area as illustrated in trench area 216, wherein via hole 206 is formed symmetrically opposite to via hole 207 in trench area 216. Alternatively, via holes can be distributed non-uniformly in a trench area as illustrated in trench areas 217-218. Lastly, there are one or more via holes at each level of semiconductor interconnects in order for all levels of the semiconductor interconnects to be electrically connected.

Figure 3:
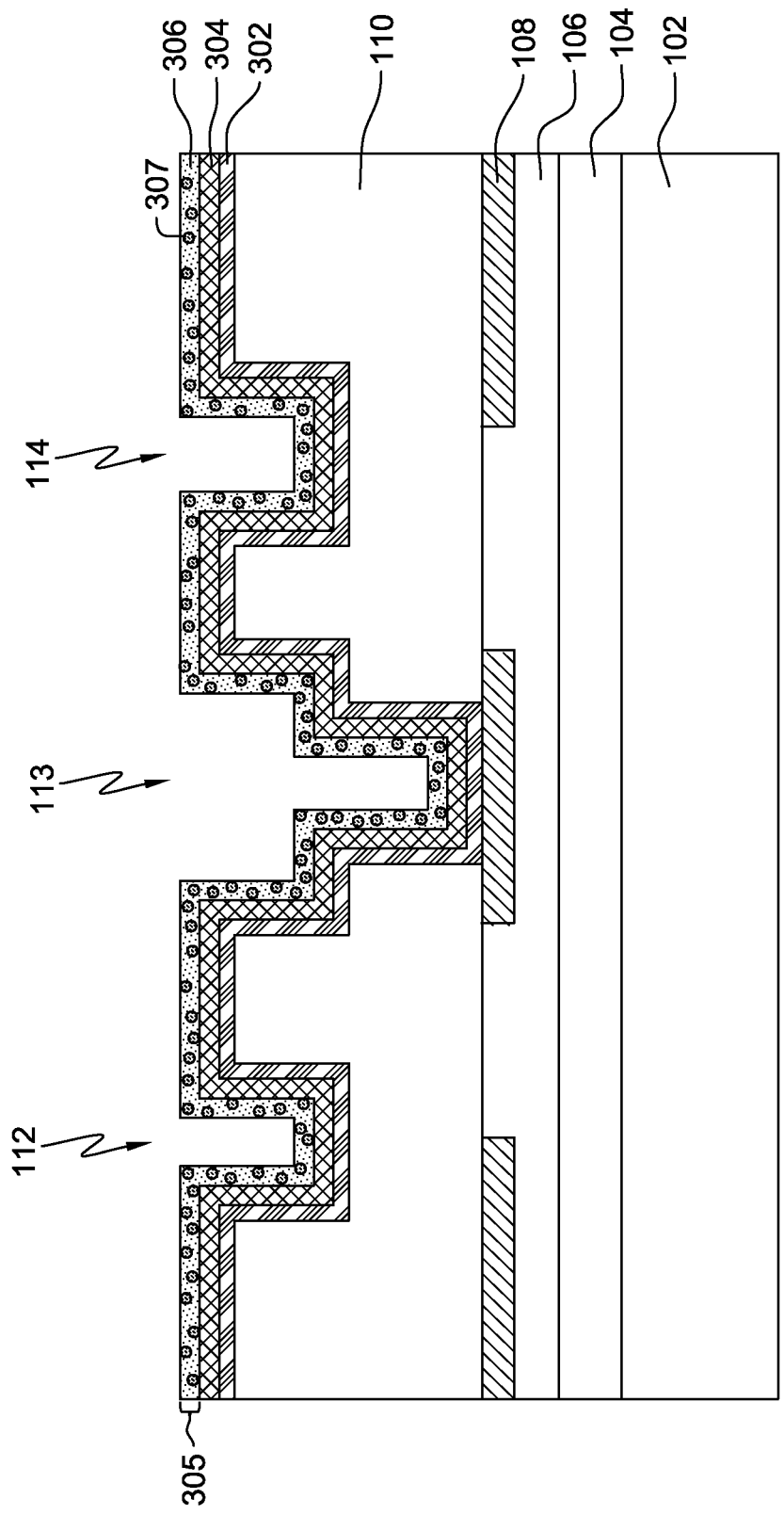
FIGS. 3-6 are pictorial representations (i.e., cross-sectional views) illustrating the formation of trench areas and via holes according to one embodiment of the present invention.

FIG. 3 depicts a cross-sectional view of substrate 102, transistor area layer 104, first dielectric layer 106, first metal layer 108, second dielectric layer 110, trench areas 112-114, via hole 116 (shown in FIG. 1), sacrificial oxidation layer 302, barrier metal layer 304, and seed layer 305 that includes copper 306 and impurities 307. Impurities 307 can include, but are not limited to, manganese, aluminum, titanium, or tin atoms. However, in the present embodiment, impurities 307 are manganese atoms.

Specifically, to form an interconnect structure, sacrificial oxidation layer 302 is disposed on trench areas 112-114 and via hole 116. Titanium, aluminum, or other material capable of minimizing oxygen intrusion into seed layer 305 and electroplated copper layer 308 (shown in FIG. 4) may be utilized to form sacrificial oxidation layer 302, but in the present embodiment titanium is utilized to form sacrificial oxidation layer 302. One advantage of utilizing titanium to form sacrificial oxidation layer 302 is that titanium provides strong adhesion to second dielectric layer 110. Another advantage of utilizing titanium to form sacrificial oxidation layer 302 is that titanium minimizes oxygen from surrounding dielectric layer 110 and oxygen from barrier metal layer 304 from intruding into seed layer 305 and electroplated copper layer 308 that are subsequently formed.

Preventing oxygen intrusion into seed layer 305 and electroplated copper layer 308 can improve electromigration reliability, because more impurities 307 will be available for reacting with copper of layers 305 and 308 to form segregated layer 316 (shown in FIG. 6) instead of impurities 307 being consumed by reacting with oxygen. Forming segregated layer 316 is important, because segregated layer 316 can suppress diffusion of copper within second metal layer 314 (shown in FIG. 6). Suppressing diffusion of copper within second metal layer 314 can reduce the amount of void formation and extrusion/hillock formation within second metal layer 314 to provide an interconnect structure with enhanced performance and reliability. Furthermore, atomic layer deposition (ALD), chemical vapor deposition (CVD), or physical vapor deposition (PVD) may be utilized to form sacrificial oxidation layer 302, but in the present embodiment PVD is utilized.

After forming sacrificial oxidation layer 302, barrier metal layer 304 is formed on sacrificial oxidation layer 302. Barrier metal layer 304 can prevent conducting material, such as copper or aluminum, from diffusing into dielectric layer 110. Metals that can act as a diffusion barrier to copper or aluminum can be utilized to form barrier metal layer 304 wherein the metals include, but are not limited to, cobalt, ruthenium, or other material that allows interconnect resistance to be reduced. In the present embodiment cobalt is utilized to form barrier metal layer 304, instead of tantalum nitride, because utilizing cobalt allows interconnect resistance to be reduced because more copper for layers 305 and 308 can be utilized for forming the interconnect structure. For example, utilizing cobalt makes more volume of the interconnect structure available for copper to be deposited within the interconnect structure. In contrast, if tantalum nitride is utilized instead of cobalt or ruthenium then additional layers will be required that will take up more volume of the interconnect structure, and leave less volume for copper. As a result, the additional layers will reduce the volume available for copper of layers 305 and 308 of the interconnect structure, and result in higher resistance of the interconnect structure.

Moreover, barrier metal layer 304 is deposited utilizing CVD. Thus, in the present embodiment, CVD of cobalt is performed to create barrier metal layer 304. The cobalt may contain oxygen due to a cobalt precursor that is utilized for performing the CVD. However, sacrificial oxidation layer 302 can minimize the oxygen, from the cobalt of barrier metal layer 304, from intruding into seed layer 305 and electroplated copper layer 308.

Subsequently, seed layer 305 is formed directly on barrier metal layer 304. ALD, CVD, or PVD may be utilized to form seed layer 305, but in the present embodiment PVD is utilized wherein seed layer 305 includes copper 306 and impurities 307 that are sputtered directly on barrier metal layer 304. An advantage of using PVD is that copper alloy films (e.g., seed layer 305) can have a high purity that is free from unwanted impurities such as oxygen, carbon, and nitrogen. Thus, in the present embodiment seed layer 305 is a copper-manganese alloy formed utilizing PVD, but in an alternative embodiment seed layer 305 can be a copper-aluminum alloy formed using PVD. In addition, in an alternative embodiment (not shown), CVD may be utilized, because CVD allows for trench areas and via holes to be filled while also minimizing pinch-offs, void formation, and extrusion/hillock formation. If CVD is utilized to form seed layer 305 then a copper first layer of seed layer 305 can first be deposited on barrier metal layer 304 using CVD, followed by CVD of a manganese second layer of seed layer 305 (i.e., CVD of impurities) on the copper first layer, and followed by CVD of a copper third layer of seed layer 305 on the manganese second layer. Thus, in an alternative embodiment (not shown), seed layer 305 can include a copper first layer, a manganese second layer (i.e., impurities), and a copper third layer all deposited utilizing a CVD process. Still in another embodiment, to form seed layer 305 copper-manganese layer or copper-aluminum layer can first be deposited utilizing CVD followed by CVD of a copper layer.

Figure 4:
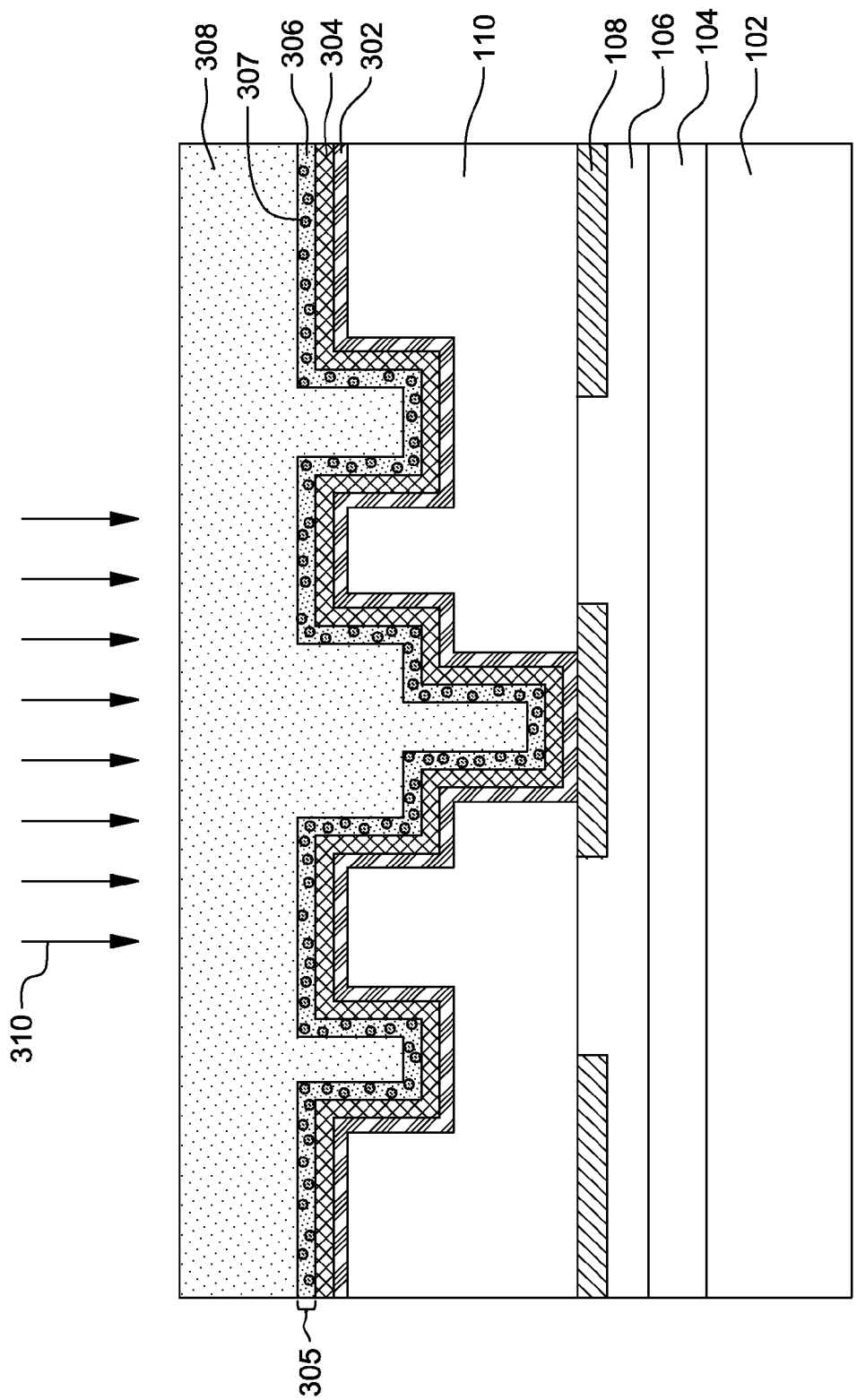

FIG. 4 illustrates the formation of electroplated copper layer 308. Specifically, electroplated copper layer 308 is disposed on seed layer 305. As a result, unfilled trench areas 112-114 (shown in FIG. 3) and via hole 116 (shown in FIG. 1) are filled with copper, utilizing an electroplating technique. In addition, post plating anneal 310 occurs causing copper grain growth. The post plating anneal is performed at a temperature ranging from about 50° C. to 350° C. However, in the present embodiment, the post plating anneal 310 does not result in much diffusion of impurities 307 (e.g., manganese atoms) within seed layer 305.

Figure 5:
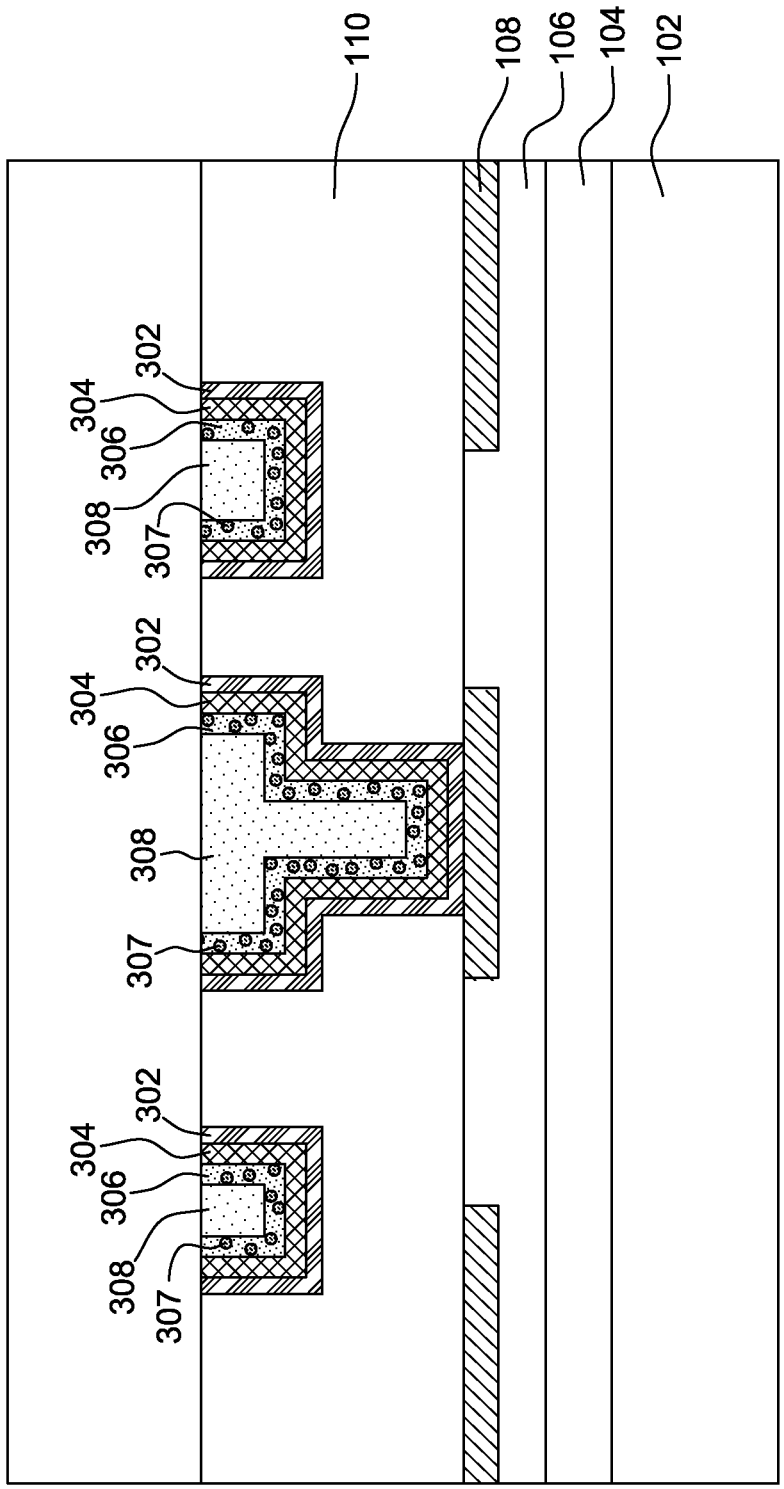

FIG. 5 illustrates an end result of a chemical-mechanical planarization (CMP) process. The purpose of the CMP process is to remove a portion of layers 302, 304, 305, and 308, which provides for the formation of a quality interconnect structure and clears the way for forming a dielectric capping layer.

Figure 6:
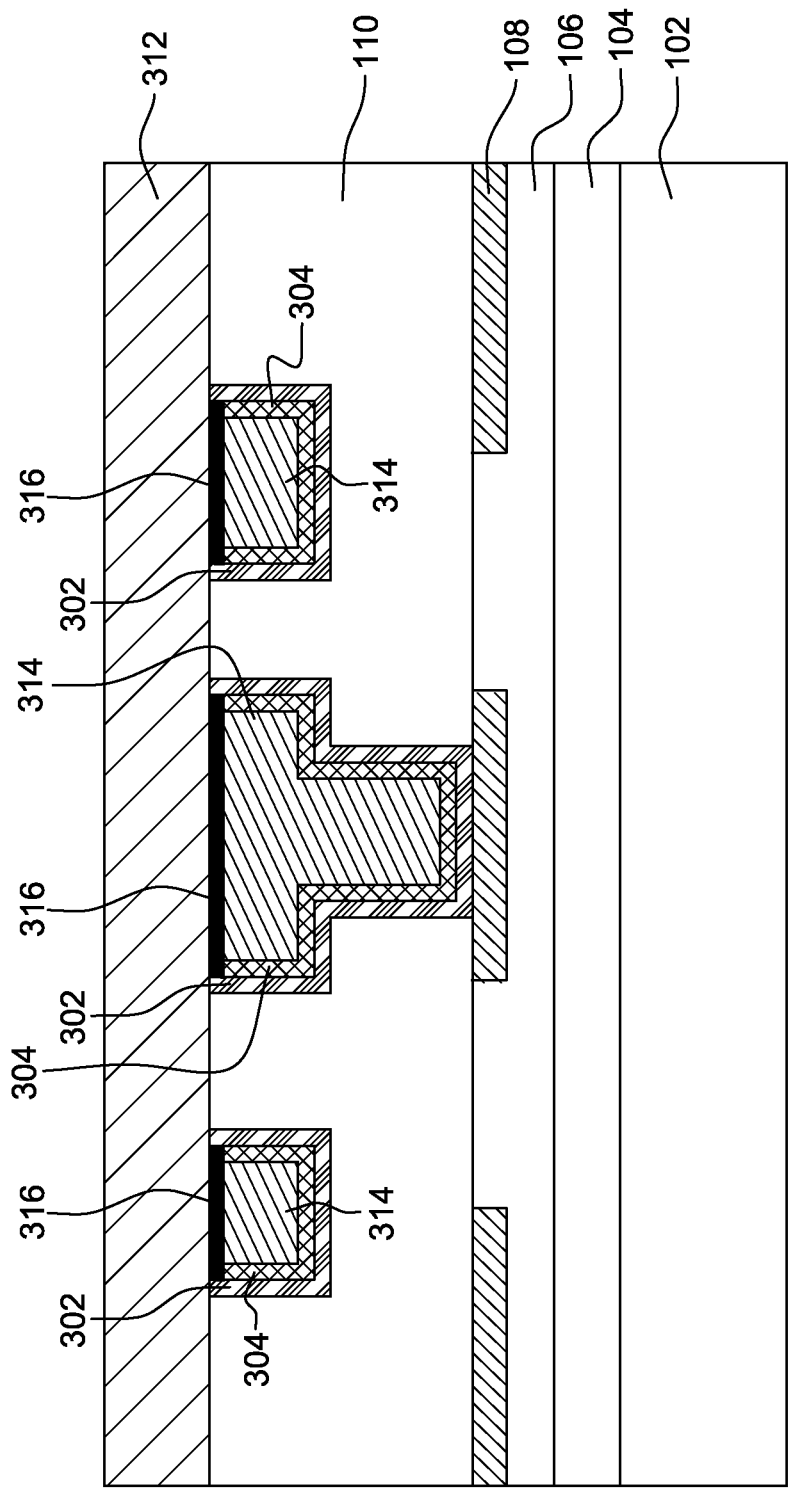

FIG. 6 illustrates the formation of dielectric capping layer 312. In the present embodiment, dielectric capping layer 312 is formed after the CMP process illustrated in FIG. 5. The formation of dielectric capping layer 312 occurs at temperatures high enough (i.e., between about 350° C. to 400° C.) to enhance copper grain growth of copper 306 within seed layer 305 (shown in FIG. 4), and also to enhance diffusion of impurities 307 (shown in FIG. 5) (e.g., manganese) within seed layer 305 and electroplated copper layer 308 (shown in FIG. 5). As a result, seed layers 305 and electroplated copper layer 308 merge into a single second metal layer 314. Thus, in the present embodiment second metal layer 314 is a copper-manganese alloy, but in an alternative embodiment second metal layer 314 can be a copper-aluminum alloy.

Furthermore, as a result of the diffusion of impurities 307 within seed layer 305 and electroplated copper layer 308, triggered by the formation of dielectric capping layer 312, a high concentration of impurities 307 (e.g., manganese) remains at the interface between dielectric capping layer 312 and second metal layer 314. Accordingly, the high concentration of impurities 307 (e.g., manganese) forms a segregated layer 316 at the interfaces between dielectric capping layer 312 and second metal layer 314. Segregated layer 316 can suppress diffusion of copper atoms at the interface between second metal layer 314 and segregated layer 316, and thereby reduce the amount of void formation and extrusion/hillock formation within second metal layer 314 to provide an interconnect structure with enhanced performance and reliability. Additionally, a via hole opening can be created in dielectric capping layer 312 to provided connectivity to a subsequent metal layer.

Furthermore, those skilled in the art will note from the above description, that presented herein is a novel structure and method for fabricating an interconnect having enhanced performance and reliability by minimizing oxygen intrusion into a seed layer and an electroplated copper layer of the interconnect structure. Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. An interconnect structure comprising:
    at least one opening in a dielectric layer;
    a sacrificial oxidation layer disposed in the opening;
    a barrier metal layer disposed on the sacrificial oxidation layer;
    a seed layer disposed on the barrier metal layer, wherein the seed layer comprises copper and impurities, and wherein the impurities include manganese, aluminum, tin, or a combination thereof;
    an electroplated copper layer disposed on the seed layer; and
    a capping layer disposed over the dielectric layer and the electroplated copper layer.

2. The interconnect structure of claim 1, wherein the at least one opening further comprises a trench area, a trench area with at least one via hole, or a combination thereof.

3. The interconnect structure of claim 1, wherein the sacrificial oxidation layer comprises titanium, aluminum, other material capable of minimizing oxygen intrusion into the seed layer and the electroplated copper layer, or a combination thereof.

4. The interconnect structure of claim 1, wherein the sacrificial oxidation layer is formed utilizing atomic layer deposition (ALD), chemical vapor deposition (CVD), or physical vapor deposition (PVD).

5. The interconnect structure of claim 1, wherein the barrier metal layer comprises cobalt, ruthenium, other material that allows interconnect resistance to be reduced by making more volume of the interconnect structure available for copper to be deposited, or a combination thereof.

6. The interconnect structure of claim 1, wherein the barrier metal layer is formed utilizing chemical vapor deposition (CVD).

7. The interconnect structure of claim 1, further comprising a segregated layer in contact with the electroplated copper layer, wherein the segregated layer comprises manganese, aluminum, tin, or a combination thereof.

8. The interconnect structure of claim 1, wherein the capping layer is a dielectric capping layer.

9. The interconnect structure of claim 7, wherein the segregated layer is contiguous with the capping layer.

10. The interconnect structure of claim 7, wherein the segregated layer is above the barrier metal layer.

11. An interconnect structure comprising:
    at least one opening in a dielectric layer;
    an oxidation layer disposed on a periphery of the opening;
    a barrier metal layer disposed on the oxidation layer;
    an alloy disposed on the barrier metal layer within the opening;
    a segregated layer disposed over the alloy; and
    a capping layer disposed over the segregated layer and the oxidation layer, such that the segregated layer separates the alloy from the capping layer.

12. The interconnect structure of claim 11, wherein the segregated layer comprises copper and impurities, and wherein the impurities include manganese, aluminum, tin, or a combination thereof.

13. The interconnect structure of claim 11, wherein the alloy is a copper-aluminum alloy.

14. The interconnect structure of claim 11, wherein the alloy is a copper-manganese alloy.

15. The interconnect structure of claim 11, wherein the segregated layer is above the barrier metal layer.

16. The interconnect structure of claim 11, wherein the oxidation layer includes titanium or aluminum.

17. The interconnect structure of claim 16, wherein the oxidation layer further includes oxygen.

18. The interconnect structure of claim 11, wherein the barrier metal layer includes cobalt.

19. The interconnect structure of claim 11, wherein the segregated layer has a higher impurity concentration than the alloy.

* * * * *